United States Patent [19]

MacCollum

[11] Patent Number: 5,279,889
[45] Date of Patent: Jan. 18, 1994

[54] IMAGING LAMINATE WITH IMPROVED TAB FOR DELAMINATION

[75] Inventor: George O. MacCollum, Bellingham, Mass.

[73] Assignee: Polaroid Corporation, Cambridge, Mass.

[21] Appl. No.: 799,090

[22] Filed: Nov. 27, 1991

[51] Int. Cl.⁵ .............................................. B41M 5/26
[52] U.S. Cl. .................................. 428/212; 428/35.7; 428/195; 428/202; 428/213; 428/913
[58] Field of Search ............... 428/195, 212, 914, 412, 428/480, 220, 35.7, 420, 428.1, 192, 198, 202, 213, 913

[56] References Cited

U.S. PATENT DOCUMENTS

| | | | |
|---|---|---|---|
| 3,266,797 | 8/1966 | Stievenart | 271/64 |
| 3,924,041 | 12/1975 | Miyayama et al. | 428/212 |
| 4,157,412 | 6/1979 | Deneau | 428/147 |
| 4,418,105 | 11/1983 | Stratton | 428/40 |
| 4,670,085 | 6/1987 | van der Meer et al. | 156/584 |
| 4,885,198 | 12/1989 | Kimura | 428/77 |

FOREIGN PATENT DOCUMENTS

| | | |
|---|---|---|
| 348356 | 12/1989 | European Pat. Off. . |
| 62-152707 | 7/1987 | Japan . |
| 88/04237 | 6/1988 | PCT Int'l Appl. . |

Primary Examiner—Patrick J. Ryan
Assistant Examiner—W. Krynski
Attorney, Agent, or Firm—Louis G. Xiarhos

[57] ABSTRACT

A composite laminar structure for producing complementary images in a frangible image-forming substance, and having a strengthened tab portion for facilitation of the separation of the respective sheets of the laminar structure without detachment of the tab portion is described. Thermal imaging composite structures and a method for preparing structures suited to the production of high resolution images in frangible image-forming substance, and especially adapted to sheet separation by mechanical apparatus, are described.

12 Claims, 3 Drawing Sheets

IMAGING LAMINATE WITH IMPROVED TAB FOR DELAMINATION

BACKGROUND OF THE INVENTION

This invention relates to an imaging laminate having between a pair of sheets a layer of frangible image-forming substance separable to the respective sheets thereof. More particularly, it relates to a laminar structure particularly adapted to separation of the sheets thereof by mechanical apparatus.

Laminar imaging materials comprising a pair of sheets and a layer of image-forming substance therebetween have been known. For example, laminar thermal imaging materials for the production of images by exposure to heat and separation of the sheets thereof have been described in U.S. Pat. No. 3,924,041 (issued Dec. 2, 1975 to M. Miyayama, et al.); in U.S. Pat. No. 4,157,412 (issued Jun. 5, 1979 to K. S. Deneau); and in International Patent Application No. PCT/US87/03249 of M. R. Etzel (published Jun. 16, 1988 as International Publication No. WO 88/04237). It will be appreciated that an image-forming substance confined between a pair of sheets will be protected against abrasion and rub-off. In addition, a laminar medium can be handled as a unitary structure, thus, obviating the requirement of bringing the respective sheets of a two-sheet imaging medium into proper position in a printer or other apparatus used for imaging of the medium material.

In the aforementioned International Patent Application No. PCT/US87/03249, there are described certain preferred embodiments of a high resolution thermal imaging medium, which embodiments include a porous or particulate image-forming substance in a laminate structure between a pair of sheets. Upon separation of the respective sheets after laser exposure of portions or regions of the medium, a pair of complementary images is obtained.

In the copending and commonly assigned U.S. patent application of William P. Tobin, U.S. Ser. No. 07/616,796, filed Nov. 21, 1990, there are disclosed certain preferred laminar thermal imaging materials, in the form of individually sized (formatted) thermal imaging laminates. These laminates include a marginal (tab) portion to facilitate separation of the respective sheets of the laminate after a suitable laser scanning exposure. According to a preferred embodiment disclosed therein, the marginal (tab) portion is provided by a score line which severs a marginal portion of one of the sheets and the frangible layer from the remainder of such sheet and layer. Individual (formatted) thermal imaging laminates of the type shown in U.S. application Ser. No. 07/616,796 can be stacked in a cassette for supply to a drum or other zone of a printing apparatus and, after thermal exposure, can be separated by an automated delamination device. A suitable such device is described therein.

As is disclosed in application U.S. Ser. No. 07/616,796, and in the aforementioned International Application PCT/US87/03249, the image-forming substance of the thermal imaging media thereof is designed to fracture vertically, i.e., in a direction normal to the surface of the layer of image-forming substance. Vertical frangibility of the image-forming layer permits the production of images of desirably high resolution and optical density. The apparatus described in the aforementioned U.S. application Ser. No. 07/616,796, in an automated fashion, initiates separation of the sheets of an exposed film unit at the leading (tab) edge thereof and completes the delamination process, for vertical fracture and separation of abutting regions of image-forming substance.

Other apparatus for and methods of delaminating formatted thermal imaging laminates of the type described in U.S. application Ser. No. 07/616,796 are described in the application of A. M. Binder for APPARATUS AND METHOD FOR DELAMINATING A COMPOSITE LAMINATE STRUCTURE, U.S. Ser. No. 07/799,085, filed Nov. 27, 1991, now U.S. Pat. No. 5,169,474; in the application of F. S. Silveira, et al., for APPARATUS AND METHOD FOR DELAMINATION OF A LAMINATE, U.S. Ser. No. 07/800,467, filed Nov. 27, 1991, now U.S. Pat. No. 5,169,476; and in the United States patent of D. F. Schuh, et al., for APPARATUS AND METHOD FOR CONTROLLING THE DELAMINATION OF A LAMINATE, issued Aug. 25, 1992 as U.S. Pat. No. 5,141,584.

While various embodiments of mechanical apparatus can be employed to initiate and complete the separation of the sheets of a composite structure having a marginal portion as aforesaid, it has been found that undesired delamination of the composite tab or marginal portion can occur as the result of physical stresses applied by mechanical delamination apparatus to the tab end of the laminate during operation of the delamination process. It will be appreciated that a complete or partial delamination of the composite tab portion, and entanglement of a detached tab portion in the delamination apparatus or larger apparatus of which the delamination apparatus is a part, will be particularly disadvantageous and will hamper the efficient operation of any such apparatus. Accordingly, there will be interest in a laminar composite structure of the aforedescribed type having a tab portion which exhibits a substantial resistance to detachment from the remainder of the structure.

SUMMARY OF THE INVENTION

It has been found that a composite laminate having a marginal or tab portion for facilitation of the desired separation of respective sheets thereof can be substantially improved in its suitability for delamination by mechanical apparatus by providing an improved composite marginal or tab structure, the layers of which are bonded to one another substantially more strongly than the corresponding layers of the major and remaining portion of the composite laminate.

In an article aspect, the present invention provides a composite laminar structure, comprising;

a frangible layer of an image-forming substance, said layer having first and second opposite surfaces;

a first sheet adhered to said first surface at a first strength, abutting areas of said frangible layer being, upon exposure of said laminar structure to intense radiation, adherable to said first surface at a second strength greater than said first strength;

a second sheet congruent with said first sheet and adhered to said second surface at a predetermined substantially uniform strength, said predetermined substantially uniform strength being greater than said first strength and less than said second strength; and a marginal portion for facilitating separation of said sheets after said exposure, said marginal portion being defined by a cut line severing a marginal portion of one of said sheets and said frangible layer from the remainder of said one sheet and layer;

the marginal portion of said one sheet being adhered through said frangible layer to the other of said sheets substantially more strongly than is the remainder of said one sheet to said other of said sheets.

According to a method aspect of the present invention, there is provided a method of preparing a laminar composite structure which comprises the steps of:

providing a composite laminar structure, said composite laminar structure comprising a pair of sheets having therebetween at least a layer of vertically frangible image-forming substance preferentially adhered to one sheet of said pair of sheets, the preferential adhesion of abutting portions of such layer of image-forming substance for said one sheet being reversible in areas of predetermined imaging exposure of said composite laminar structure and being attachable to the other of said pair of sheets as a result of said exposure, for provision of a pair of complementary images upon separation of the sheets after said exposure;

cutting said composite laminar structure into individual laminar units of predetermined size;

defining a marginal portion of said laminar units by cutting a marginal portion of one of said sheets and said frangible layer from the remainder of said one sheet and layer; and securing said defined marginal portion of said one sheet substantially more strongly to the other of said pair of sheets than said remainder of said one sheet to said other of said sheets.

BRIEF DESCRIPTION OF THE DRAWINGS

Reference is made to the accompanying drawings in which there are shown illustrative embodiments of the invention, from which its novel features and advantages will be apparent, wherein.

DETAILED DESCRIPTION OF THE INVENTION

Figure 1:
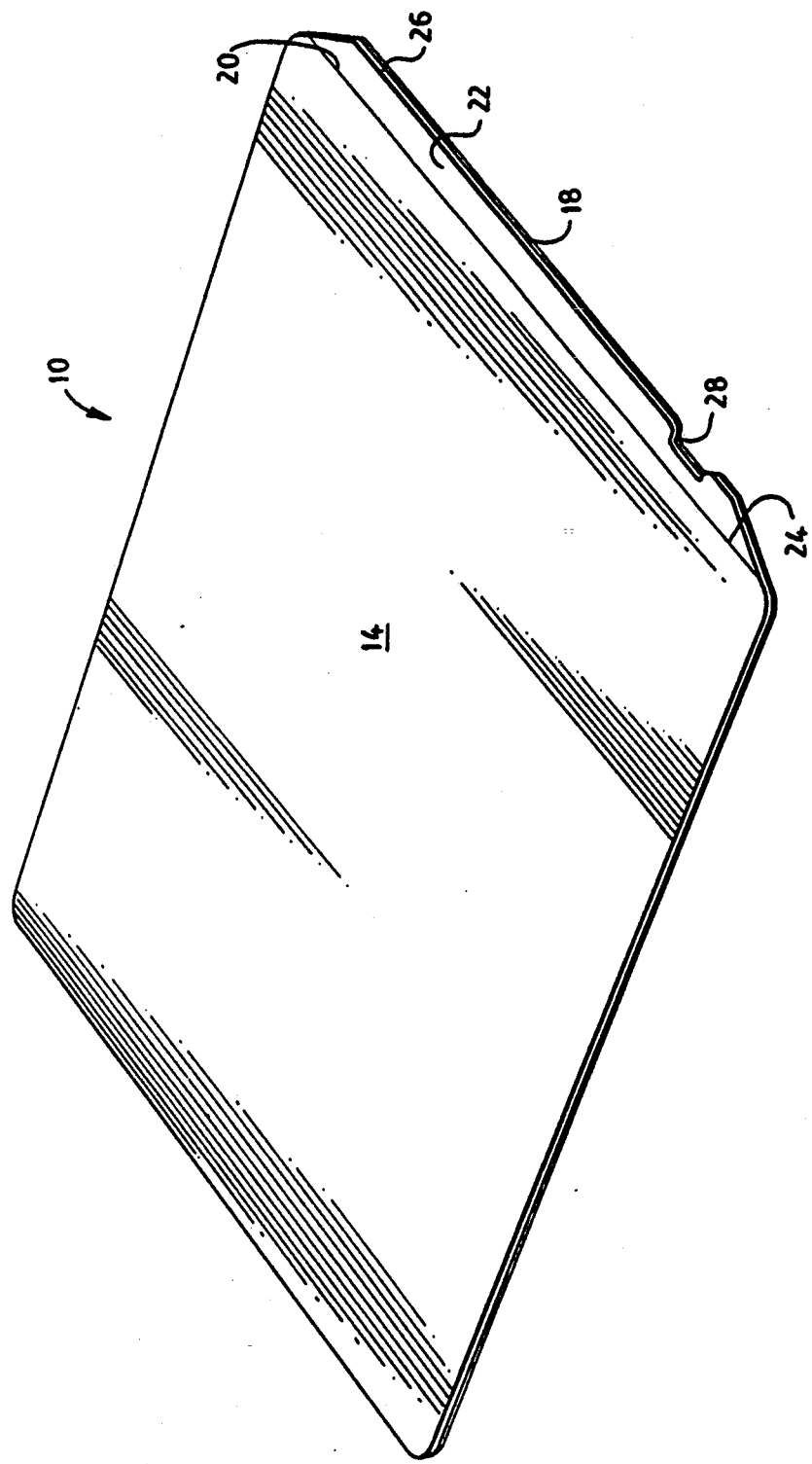
FIG. 1 is a perspective view of a preferred embodiment of a composite laminar structure of the invention.
Figure 2:
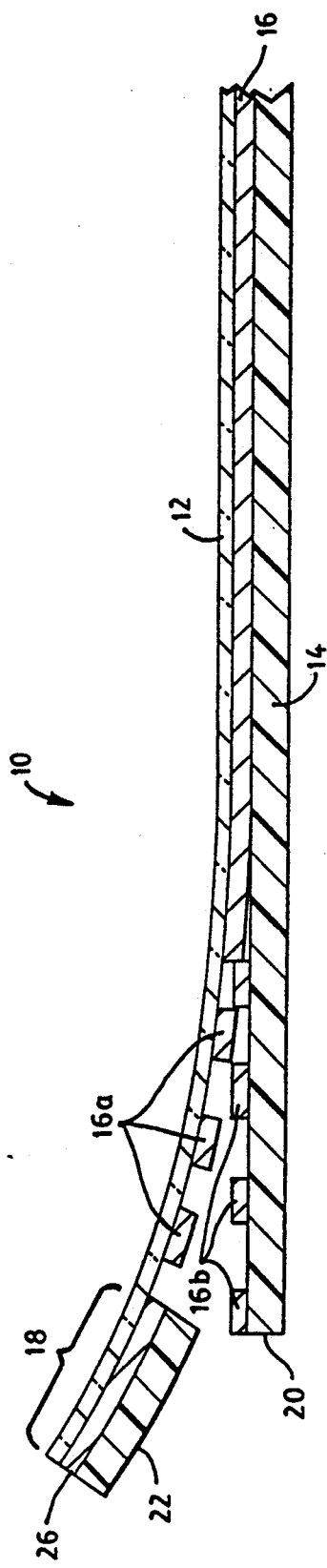
FIG. 2 is a view in longitudinal section of the composite laminar structure of FIG. 1, shown in a state of partial separation and depicting certain aspects of its separation into complementary images, with thicknesses of its layers being exaggerated for clarity.

Referring now to the drawings, and particularly to FIGS. 1 and 2, a laminar composite structure 10 is shown in a preferred embodiment as a thermal imaging film unit of the general kind disclosed by the aforementioned International Application PCT/US 87/03249 and the aforementioned patent application of W. P. Tobin, U.S. Ser. No. 07/616,796. The film unit comprises support sheets 12 and 14, each adhesively connected to opposite surfaces of a frangible layer 16 of image-forming substance 16. For purposes of the present invention, it is sufficient to note that layer 16 is such that it may be ruptured or fractured in a direction normal to its two surfaces, i.e., along lines defined by exposure, as is described in the International Application, supra. Portions of layer 16 subjected to exposure can then be separated from portions not affected by exposure to provide complementary images on the respective sheets of the composite sheet structure.

As used herein, reference to vertical frangibility of layer 16 is intended to refer to the capacity of abutting portions of the layer 16 of image-forming substance to be separated, as a function of a predetermined imaging exposure of the composite laminar structure, along a direction normal to the surfaces of the layer. Thus, on separation of the respective sheets of the composite laminar structure, a pair of complementary images of desired high resolution and optical density is obtained. It will be understood that the separation of abutting regions or areas of frangible layer 16 for production of complementary images in image-forming substance will require that the layer have sufficient cohesivity as to preclude the partitioning of regions of layer 16 by fracture between its surfaces, i.e., along horizontal lines. Since layer 16, as described in greater detail hereinafter, can be associated with additional layers for proper imaging of the composite structure, cohesive failure along horizontal lines is permissible and desirable in particular instances, provided that such failure does not occur with a layer, such as a pigment layer, which provides desired optical density.

As used herein, and except where otherwise specified, "adhesion" of a layer or "connection" of a layer to a sheet or other layer or surface refers to adhesion or connection either directly or indirectly. Thus, the layer can be adhered or connected to a sheet or other layer or surface by being contiguous therewith or by adhesion or connection through one or more other layers.

According to a preferred embodiment of the composite laminar structure 10 of FIG. 1, layer 16 will comprise a frangible layer of image-forming substance such as a layer of colorant (e.g., carbon black) in a suitable binder. Such a layer can be deposited onto sheet 12 using known coating methods, for provision of a thin layer having desired and predetermined optical density. Sheet 12 can comprise polyester or other material having, for example a subcoat of heat-activatable polymeric material (not shown) for more firm attachment of exposed regions of layer 16 to sheet 12 as a function of a laser exposure. In general, layer 16 will comprise a frangible layer which is adhered to sheet 12 at a first strength sufficient to prevent accidental dislocation, but which as a function of exposure can be more firmly secured to sheet 12 at a second and greater strength. Shown in the embodiment of FIG. 1 is a sheet 14 which is adhered to layer 16, typically through adhesive and release layers (not shown). Sheet 14 is adhered to layer 16 at a strength which is greater than the aforesaid first strength, such that, layer 16 is preferentially adhesive to sheet 14 prior to exposure. Upon exposure and heat activation of the surface between sheet 12 and layer 16, the preferential adhesion of layer 16 for sheet 14 is reversed, i.e., exposed regions of layer 16 are now connected or attached more firmly to sheet 12, at a strength greater than the aforesaid first strength and greater than the bond strength between sheet 14 and layer 16. Since the adhesion of sheet 14 to layer 16 is greater in non-exposed regions than the initial strength between coated layer 14 and sheet 12, separation of sheets 12 and 14 after image exposure results in non-exposed regions of layer 16 being separated from the layer to sheet 14.

As is shown in FIG. 2, and as a result of laser exposure of the depicted and preferred embodiment, portions 16a of layer 16 become more firmly bonded to sheet 12. Portions 16a of layer 16, and abutting portions 16b which have not been affected by heat, may then be separated from each other when the sheets 12 and 14 are delaminated.

The sheets 12 and 14 may be made of the same or of different material, polyethylene terephthalate, polystyrene, polyethylene, polypropylene, copolymers of styrene and acrylonitrile, polyvinyl chloride, polycarbonate and vinylidene chloride being some but not all of the material suited as support sheets. They may themselves be laminar structures provided with a backing of paper (not shown) or any other material suited for any specific purpose. It will be understood that the backing material should be transmissive of exposing radiation or be either removable to permit exposure, or positioned on a sheet opposed from that through which exposure is accomplished. While it is not a requirement, it has been found to be advantageous to have one of the sheets stiffer, i.e., less flexible than the other. The difference in stiffness may be provided by a difference in the materials of which the sheets 12 and 14 are made. Preferably, however, and as shown, the different stiffnesses are attained by one of the sheets 12 being thinner than the other sheet 14.

For purposes mentioned previously, sheet 12 is provided with a marginal portion 18 which extends beyond an adjacent margin 20 of sheet 14. As a matter of efficient manufacture, and as shown, the marginal portion (or tab) 18 is provided by portion 22 of sheet 14 which is cut or severed from sheet 14 by a score or cut line 24 along margin 20 of sheet 14.

As can be appreciated from FIG. 2, tab portion 18 facilitates the separation of sheets 12 and 14 after exposure. Separation or delamination of sheets 12 and 14 is accomplished using delamination apparatus, such as the apparatus described: in the aforementioned application of W. P. Tobin, U.S. Ser. No. 07/616,796; in the aforementioned application of A. M. Binder for APPARATUS AND METHOD FOR DELAMINATING A COMPOSITE LAMINATE STRUCTURE, U.S. Ser. No. 07/799,090, filed Nov. 27, 1991; in the application of F. S. Silveira, et al., for APPARATUS AND METHOD FOR DELAMINATION OF A LAMINATE, U.S. Ser. No. 07/800,467, filed Nov. 27, 1991 now U.S. Pat. No. 5,169,476 and in the United States Patent of D. F. Schuh, et al., for APPARATUS AND METHOD FOR CONTROLLING THE DELAMINATION OF A LAMINATE, issued Aug. 25, 1992 as U.S. Pat. No. 5,141,584. Separation of sheets 12 and 14 using such apparatus involves the application of physical stresses to the common free edge 26 of marginal portions 18 and 22 and intermediate layer 16. Such stresses can result in delamination of portion 22 of tab 18 from sheet 12.

As has been mentioned previously, layer 16 is initially bonded to layer 12 sufficiently to prevent accidental dislocation. Such initial bonding strength facilitates removal of non-exposed regions of layer 16 to sheet 14, in the major area 14 (FIG. 1) of composite laminar structure 10. The relatively weak adhesion between layer 16 and sheet 12 makes possible, however, the accidental delamination or detachment of marginal sheet portion 22 from the composite tab structure 18, in the form of a narrow strip that can be entangled in the delamination apparatus. Since the tab portion comprises a narrow strip 22 of sheet 14 laminated to sheet 12 through a correspondingly narrow strip or layer of image-forming substance, an initiated delamination of strip 22 can be propagated readily by application of further stress to the composite tab structure, resulting in a complete detachment of marginal portion or strip 22.

According to the present invention, marginal portion 22 is caused to be adhered to sheet 12 substantially more strongly than the remainder of sheet 14. A secure bonding of portion 22 to sheet 12 can be accomplished in a number of ways and, for example, can be effected by resort to mechanical or chemical methods, or by using a combination of mechanical and chemical treatments. Preferably, the securing of marginal portion 22 to sheet 12 will be the result of a convenient operation conducted during the manufacture of the formatted composite laminar structure 10 of FIG. 1.

A convenient method of manufacturing laminates of the type shown in FIG. 1 involves the production of an endless web of laminar material comprising sheets 12 and 14 and layer 16 therebetween, and the cutting therefrom of individually sized (formatted) film units of a predetermined size. Such units can be cut from a web of material using known slitting and cutting apparatus.

From FIG. 1, it can be seen that preferred composite laminate 10 comprises congruent sheets 12 and 14. The periphery of composite laminar structure 10 can be defined by a cutting and stamping operation. The cutting of sheet 14 along cut or score line 24 can be accomplished using any of a variety of cutting means, such as a stamping die a straight-edge cutting knife moved translationally along line 24, a laser cutter, or a rolling knife or rotary or swing die traversed along line 24. Line 24 can be cut any convenient time in the manufacturing process, i.e., before, after or simultaneously with the cutting of the periphery of composite laminar structure 10 from the web material from which it is made, or before or after such cutting.

It will be seen from FIG. 2, that sheet 14 is cut along line 24 only through frangible layer 16 to provide a composite tab structure which defines also the major portion of sheet 14. The length of the composite laminar structure 10 measured between the score line 24 and a rear edge may typically be about 25.5 cm (10 in.), its width may be about 20 cm (8 in.), and the dimension of the marginal portion 18 between its forward edge 26 and the score line 24 may be about 6.5 mm (0.25 in.). The thicknesses of the sheets 12 and 14 measure, respectively, about 0.013 to 0.178 mm (0.5 to 7 mil) and 0.038 to 0.254 mm (1.5 to 10 mil), good results having been obtained with sheets of thicknesses of 0.044 and 0.178 mm (1.75 and 7 mil), respectively. Other dimensions may, of course, be substituted. Preferably, the corners of the sheets 12 and 14 are rounded.

In a common free edge 26 of the marginal portions 18 and 22 and the intermediate layer 16 there is provided a notch 28 which may conveniently serve as an alignment means for correctly placing the laminar film unit 10, or a plurality thereof, in a cassette (not shown) provided with a complementary protrusion in an orientation to ensure that the sheet 12 is facing upwardly from proper placement within the apparatus of this invention.

Marginal portion 22 of sheet 14 can be securely affixed to sheet 12 by the application of heat and pressure to composite tab structure 18. A pair of opposed dies for application of heat and pressure to the outer surfaces of sheets 12 and 14 of tab 18 can be used to increase adhesion by softening, fusion or interpenetration of layers therebetween. Either or both of the dies can have smooth or textured surfaces. Conditions of heat and pressure will vary with the particular nature of the laminar composite structure. Typically, good results can be obtained by using pressures in the range of about 20 to about 80 lbs/in$^2$ (138 to 552 Kilopascals) at temperatures of from about 38° C. to about 71° C. (100° F. to 160° F.).

In general, heat and pressure will be applied to the opposed surfaces of composite tab structure 18 for a dwell time than will vary with the nature of the layers of the composite structure. In general, the tab portion will be strengthened within a short dwell time which typically will range from less than one second to normally not more than about ten seconds, e.g., in a range of from two to three seconds.

If desired, the securement of marginal portion 22 to sheet 12 can be effected using a plurality of spaced pins for piercing through the composite at predetermined locations within marginal portion 22. Preferably, from the standpoint of maintaining relative flatness and smoothness of tab 18 and avoiding punctured surface irregularities, a pair of die surfaces having relatively smooth surfaces will be desired. Die surfaces having surface structure sufficient to provide minor deformations or embossments and substantial strengthening of tab 18 can also be used. For example, dies which provide a pattern or engravement in the nature of stippling provide a strongly bonded tab portion and will be preferred.

If desired, chemical adhesion and treatments can be used to promote a strengthened bond between marginal portion 22 and sheet 12. In the copending and commonly assigned patent application of N. F. Kelly, et al., U S. Ser. No. 07/616,853, filed Nov. 21, 1990, and in the patent application of K. J. McCarthy, et al., U.S. Ser. No. 07/798,899, filed Nov. 27, 1991 now U.S. Pat. No. 5,229,247, there are described certain hardenable (curable) adhesive compositions for the production of thermal imaging laminates. Such adhesive compositions include those which contain a polymeric binder and a polymerizable monomer and which after lamination can be cured by exposure to ultraviolet (UV) irradiation.

In the production of composite laminar structures of the type shown in FIGS. 1 and 2, a curable adhesive of the aforedescribed type can be used for lamination of sheet 14 to a sheet carrying a coated layer 16 of image-forming substance. After the cutting of formatted units, the individual units can be subjected to a source of ultraviolet for the curing of the adhesive of only the major portion of the composite structure. A mask can be used to prevent the blanket UV exposure from curing the adhesive layer in tab 18. Polymerizable monomer from the uncured adhesive layer permeates the composite tab structure and generates a degree of tackiness which promotes a strong bonding of marginal portion 22 of sheet 14 to sheet 12. The strength of this bond is markedly greater than the predetermined bond strength existing between the major portion of sheet 14 and sheet 12.

An effective bonding of marginal portion 22 to sheet 12 can be effected by a combination of adhesivity promoted by the use of a tacky and uncured adhesive layer and by application of heat and pressure.

Reference is made to the adhesion of marginal portion 22 of sheet 14 to sheet 12 substantially more strongly than the remainder of sheet 14 is adhered to sheet 12. In general, tab portion 18 need be strengthened by mechanical and/or chemical means sufficiently to prevent partial or complete delamination of sheet portion 22 upon application of stresses thereto by an automated delamination device. Good results can be obtained, for example, by strengthening the composite tab structure so that the peel strength required for separating the marginal portion is twice or more than that needed to separate the major portion of sheet 14 from sheet 12. The amount of required strengthening will vary, however, with the particular laminar composite structure. In a structure such as that described in FIGS. 3 and 4, a peel strength in the major area will typically be in the range of about 0.8 grams/cm of width to about 8 g/cm of width. In such a case, tab strength can be increased to a peel strength in the range of from 1.6 to 16 g/cm of width or higher. In a preferred structure, such as is shown in FIG. 3, good results are provided where the peel strength in the major area is in the range of from 1.1 to 2.8 g/cm and the peel strength in the tab area is from 2.2 to 5.6 g/cm, or more.

While a principal advantage of the strengthened tab structure of the composite laminar structures of the invention will be to permit separation of the sheets thereof by automated delamination apparatus without tab delamination, the improved strength of the tab structure will confer benefits where other forms of physical stress are applied to the structure. Thus, the formatted film units will be protected against tab delamination that may otherwise occur as the result of the physical stresses associated with the manufacture, stacking, packaging or other handling of the film units or which occur during processing of the film units in a printer or other apparatus.

Figure 3:
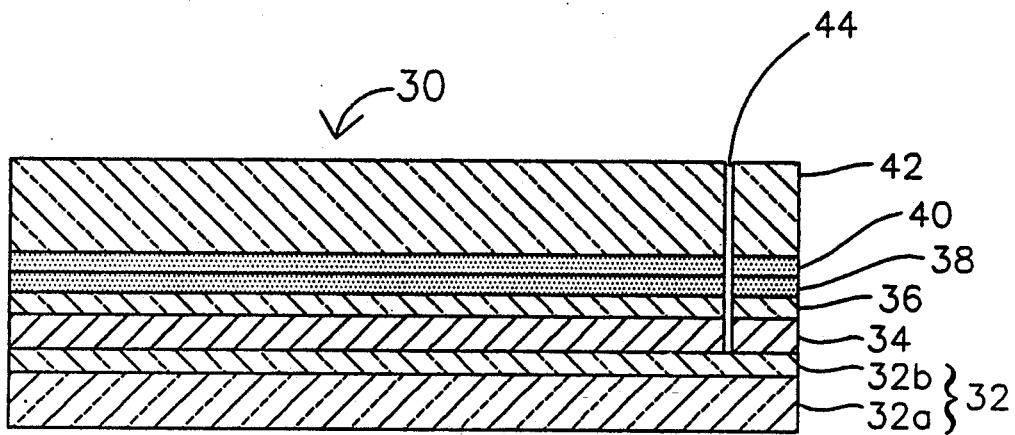
FIG. 3 is a diagrammatic cross-sectional view of another and preferred embodiment of a composite laminar structure of the invention, with thicknesses of its layers being exaggerated for clarity.
Figure 4:
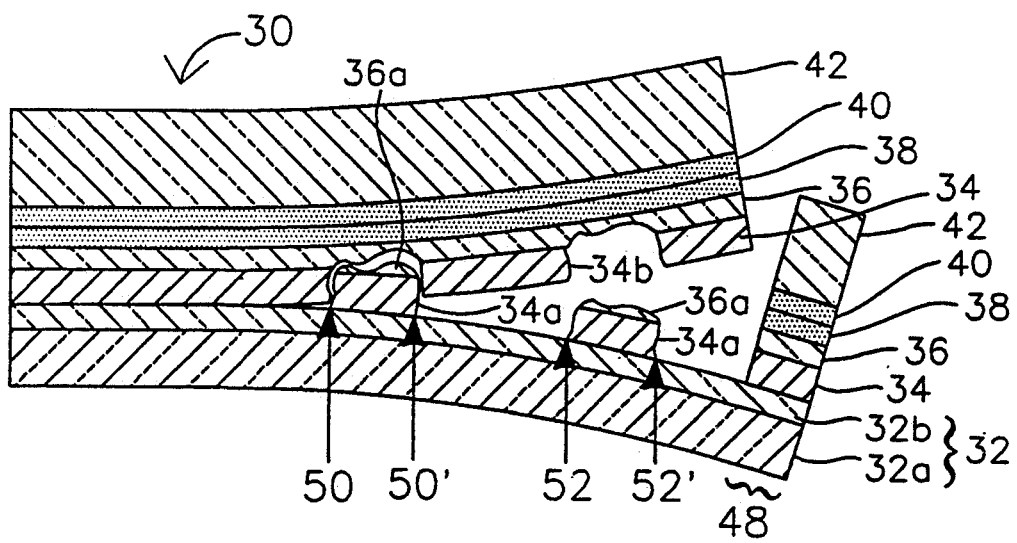
FIG. 4 is a diagrammatic cross-sectional view of the composite laminar structure of FIG. 3, shown in a state of partial separation and depicting certain aspects of its separation into complementary images.

Turning now to FIG. 3, there is shown a particularly preferred embodiment of a composite laminar structure of the invention, in the form of a thermal imaging laminar medium for the production of a pair of high resolution images by laser exposure. The laminar medium of FIG. 3 is shown in FIG. 4 in a state of partial separation.

Thermal imaging medium 30 includes a first sheet material 32 (comprising sheet material 32a and heat-activatable zone or layer 32b) having superposed thereon, and in order, porous or particulate image-forming layer 34, release layer 36, polymeric "bridge" adhesive/barrier layer 38, polymeric adhesive layer 40 and second sheet 40. In FIG. 3 is shown a cut line 44 for defining a tab or marginal portion 48 (FIG. 4) which facilitates the separation or delamination of medium 30 into a pair of complementary images. The various layers of medium material 30 are described in detail hereinafter.

Sheet 32 comprises a transparent material so that image-forming radiation can be transmitted therethrough for the imaging of medium 30. Among suitable materials are those mentioned previously in connection with sheets 12 and 14. An especially preferred sheet material from the standpoints of durability, dimensional stability and handling characteristics is polyethylene terephthalate.

Heat-activatable zone or layer 32b provides an essential function in the imaging of medium material 30 and comprises a polymeric material which is heat activatable upon subjection of the medium to brief and intense radiation, so that, upon rapid cooling, exposed portions of the surface zone or layer are firmly attached to porous or particulate image-forming layer 34. If desired, surface zone 32b can be a surface portion or region of sheet 32, in which case, layers 32a and 32b will be of the same or similar chemical composition. In general, it will be preferred that layer 32b comprise a discrete polymeric surface layer on sheet material 32a. Layer 32b will desirably comprise a polymeric material having a softening temperature lower than that of sheet material 32a, so that exposed portions of image-forming layer 34 can be firmly attached to sheet 12(12a). A variety of polymeric materials can be used for this purpose, including polystyrene, poly(styrene-co-acrylonitrile), poly(vinyl butyrate), poly(methylmethacrylate), polyethylene and poly(vinyl chloride).

The employment of a thin heat-activatable layer 32b on a substantially thicker and durable sheet material 32a permits desired handling of sheet 12 and desired imaging efficiency. The use of a thin heat-activatable layer 32b facilitates the concentration of heat energy at or near the interface between layers 32b and image-forming layer 34 and permits optimal imaging effects and reduced energy requirements. It will be appreciated that the sensitivity of layer 32b to heat activation (or softening) and attachment or adhesion to layer 34 will depend upon the nature and thermal characteristics of layer 32b and upon the thickness thereof.

Typically, sheet material 32 will vary in thickness from about 0.5 mil to seven mils (0.013 mm to 0.178 mm). Good results are obtained using, for example, a web material 32a having a thickness of about 1.5 to 1.75 mils (0.038 mm to 0.044 mm) carrying a layer 32b of poly(styrene-co-acrylonitrile) having a thickness of about 0.1 micron to five microns.

Image-forming layer 34 comprises an image-forming substance deposited onto heat-activatable zone or layer 32b as a porous or particulate layer or coating. Layer 34, also referred to as a colorant/binder layer, can be formed from a colorant material dispersed in a suitable binder, the colorant being a pigment or dye of any desired color, and preferably, being substantially inert to the elevated temperatures required for thermal imaging of medium 30. Carbon black is a particularly advantageous and preferred pigment material. Preferably, the carbon black material will comprise particles having an average diameter of about 0.1 to 10 micrometers (microns). Although the description hereof will refer principally to carbon black, other optically dense substances, such as graphite, phthalocyanine pigments and other colored pigments can be used.

The binder for the image-forming substance or layer 34 provides a matrix to form the porous or particulate substance thereof into a cohesive layer and serves to adhere layer 34 to heat-activatable zone or layer 32b. Layer 34 can range in thickness and typically will have a thickness of about 0.1 micron to about 10 microns. In general, it will be preferred form the standpoint of image resolution, that a thin layer be employed. Layer 34 should, however, be of sufficient thickness to provide desired and predetermined optical density in the images prepared from imaging medium 30.

Suitable binder materials for image-forming layer 34 include gelatin, polyvinylalcohol, hydroxyethyl cellulose, gum arabic, methyl cellulose, polyvinylpyrrolidone, polyethyloxazoline, polystyrene latex and poly(styrene-co-maleic anhydride). The ratio of pigment (e.g., carbon black) to binder can be in the range of from 40:1 to about 1:2 on a weight basis. Preferably, the ratio of pigment to binder will be in the range of from about 4:1 to about 10:1. A preferred binder material for a carbon black pigment material is polyvinylalcohol.

For the production of images of high resolution, it will be essential that image-forming layer 34 comprise materials that permit fracture substantially along the direction of arrows 50, 50', 52 and 52', shown in FIG. 4, and that have a degree of cohesivity in excess of its adhesivity for heat-activatable zone or layer 32b. Thus, on separation of sheets 32 and 42 after imaging, layer 34 will separate in non-exposed areas from heat-activatable layer 32b and remain in exposed areas as porous or particulate portions 34a on sheet 32. Layer 34 is an imagewise disruptible layer owing to the porous or particulate nature thereof and the capacity for the layer to fracture or break sharply at particle interfaces.

Shown in FIG. 3, is release layer 36 which is included in thermal imaging medium 30 to facilitate the separation of images according to the mode shown in FIG. 4. Release layer 36 is designed such that its cohesivity or its adhesion to either adhesive/barrier layer 38 or porous or particulate layer 36 is less, in exposed regions, than the adhesion of layer 34 to heat-activated zone or layer 32b. The result of these relationships is that release layer 36 undergoes an adhesive failure in exposed areas at the interface between layers 36 and 37, or at the interface between layers 34 and 36; or, as shown in FIG. 4, a cohesive failure of layer 36 occurs within the layer, such that portions (36b) are present in image 30b and portions (36a) are adhered in exposed regions to porous or particulate portions 34a. Portions 36a of release layer 36 serve to provide surface protection for the image areas of image 30a, against abrasion and wear.

Release layer 36 can comprise a wax, wax-like or resinous material. Microcrystalline waxes, for example, high density polyethylene waxes available as aqueous dispersions, can be used for this purpose. Polymeric or resinous materials such as poly(methylmethacrylate) and copolymers of methyl methacrylate and monomers copolymerizable therewith can be employed. If desired, hydrophilic colloid materials, such as polyvinylalcohol, gelatin or hydroxyethyl cellulose can be included as polymer binding agents.

Resinous materials, typically coated as latexes, can be used and latices of poly(methyl methacrylate) are especially useful. Cohesivity of layer 36 can be controlled so as to provide the desired and predetermined fractioning. Waxy or resinous layers which are disruptible and which can be fractured sharply at the interfaces of particles thereof can be added to the layer to reduce cohesivity. Examples of such particulate materials include, silica, clay particles and particles of poly(tetrafluoroethylene).

Shown in FIGS. 3 and 4, over release layer 36, is polymeric "bridge" adhesive/barrier layer 38. One function of layer 38 is that of an adhesive to assist in the lamination of a sheet 32 carrying layers 34, 36 and 38 to sheet 42 carrying adhesive layer 40. In the production of medium 30, a preferred practice is to provide first and second elements, the first element comprising sheet 32 (carrying layers 34, 36 and 37) and the second element comprising sheet 42 carrying adhesive layer 18; and to, then, laminate the elements with their respective sheets outermost int a unitary laminate. This procedure provides an adhesive-to-adhesive contact between layers 38 and 40 and a substantially uniform bonding of the elements. The lamination can be performed under ambient room temperature, or with added heat. In general, good results are obtained by laminating at temperatures of from about 70° F. to about 115° F., i.e., about 21° C. to about 46° C.

If desired, and depending upon the nature of adhesive layer 40 and its bonding to release layer 36, bridge adhesive layer 38 can be omitted. Preferably, such a layer will be employed to "bridge" the adhesion of the aforesaid first element to the second element. Methacrylate copolymers can be used for such purposes, as can a variety of other polymeric materials. An especially preferred material is one which is elastic and non-brittle and which serves as barrier to permeation of mobile or fugitive species (e.g., polymerizable monomer) from adhesive layer 40 to release layer 36. Examples of preferred materials for adhesive and barrier layer 38 are described in the copending and commonly assigned patent application of K. J. McCarthy for BARRIER LAYER IN LAMINAR THERMAL IMAGING MEDIUM, U.S. Ser. No. 07/788,899, filed Nov. 27, 1991, now U.S. Pat. No. 5,229,247. An especially preferred material for this purpose is a layer of copolymer of vinylidene chloride and a copolymerizable ethylenically unsaturated monomer.

Sheet 42 can comprise any of the sheet materials described in connection with sheets 12, 14 and 32 and is adhered to layer 38 (or to layer 36 where layer 38 is omitted) by adhesive layer 40. Examples of suitable adhesive materials are described in the aforementioned International Application No. PCT/US87/03249 and in the pending patent application of Neal F. Kelly, et al., U.S. Ser. No. 07/616,853, filed Nov. 21, 1990. Among preferred adhesive materials described therein and useful in the production of imaging laminate 30 are photohardenable adhesives comprising a macromolecular organic binder and a photopolymerizable ethylenically monomer. A principal advantage of such adhesive materials is that they permit medium 30, while the adhesive layer is in an unhardened (uncured) condition, to be cut and handled with a reduced tendency toward undesired delamination at the interface of layers 32b and 34. Such adhesive materials, on subjection of medium 30 to a blanket UV exposure, are then photohardened to a durable base layer for image 30b of FIG. 4. As mentioned previously, it may be desirable to mask the marginal (tab) portion 48 of medium 30 against such UV exposure (conducted through sheet 42). Permeation of monomer from layer 40 into composite tab structure 48 increases the strength of the tab structure and reduces the tendency for delamination thereof.

If desired, medium 30 can include an auxiliary layer to provide protection against the delamination of the medium. Thus, a stress-absorbing layer (now shown) can be incorporated between layers 32a and 32b, for protection against undesired delamination. A compressible or elongatable polyurethane layer can be used as such a stress-absorbing layer and is described in the patent application of Neal F. Kelly, U.S. Ser. No. 07/616,854, filed Nov. 21, 1990 now U.S. Pat. No. 5,200,297.

Thermal imaging medium 30 is capable of absorbing radiation at or near the interface of heat-activatable zone or layer 32b. This is accomplished by using layers in medium 30 which by their nature absorb radiation and generate the requisite heat for desired thermal imaging, or by including in at least one of the layers, an agent capable of absorbing radiation of the wavelength of the exposing source. Infrared-absorbing dyes can, for example, be suitably employed for this purpose.

It may be preferred in some instances that a light-absorbing substance be incorporated into either or both of image-forming layer 34 and heat-activatable zone or layer 32b.

Thermal imaging laminar media of the invention can be imaged by creating a thermal pattern according to the information imaged. For example, a two-sheet laminar medium, as shown in FIGS. 1 and 3 can be fastened onto a rotating drum for exposure of the medium through sheet 12 or 32. A light spot of high intensity, such as is emitted by a laser, can be used to expose the medium in the direction of rotation of the drum, while the laser is moved slowly in a transverse direction across the web, thereby to trace out a helical path. Laser drivers, designed to fire corresponding lasers, can be used to intermittently fire one or more lasers in an imagewise and predetermined manner to thereby record information according to an original to be imaged.

Apparatus and methodology for forming images from thermally actuatable media such as the composite laminar media of the present invention are described in detail in the commonly assigned patent application of E. B. Cargill, et al., entitled, Printing Apparatus, U.S. Ser. No. 07/616,658, filed Nov. 21, 1990 and abandoned in favor of application Ser. No. 07/955,360, filed Oct. 1, 1992; and in the commonly assigned patent application of J. A. Allen, et al., entitled, Printing Apparatus and Method, U.S. Ser. No. 07/616,786, filed Nov. 21, 1990 now U.S. Pat. No. 5,221,971.

Reference has been made in particular to composite laminar structures suited for the production of images by thermal exposure. The improved composite tab means embodied in such structures can, however, be employed in structures other than those particular preferred embodiments. In general, it will be understood by those skilled in the art that a secured tab means as described will be useful for the separation of the sheets of any of a variety of laminar composite sheet structures wherein the preferential adhesion of an image-forming substance to one of a pair of sheets is reversed, by thermal or other exposure, to provide complementarily abutting portions of frangible image-forming substance separable to the respective sheets. Depending upon the image-forming substance and the image-forming mechanism, the reversal of such preferential adhesion can be accomplished by either strengthening or weakening the adhesive bonding between the frangible image-forming substance and the respective sheets of the composite sheet structure.

What is claimed is:

1. A composite laminar structure, comprising;
   a frangible layer of an image-forming substance, said layer having first and second opposite surfaces;
   a first sheet adhered to said first surface at a first strength, abutting areas of said frangible layer being, upon exposure of said laminar structure to intense radiation, adherable to said first surface at a second strength greater than said first strength;
   a second sheet congruent with said first sheet and adhered to said second surface at a substantially uniform strength, said substantially uniform strength being greater than said first strength and less than said second strength; and
   a marginal portion for facilitating separation of said sheets after said thermal exposure, said marginal portion being defined by a cut line severing a marginal portion of one of said sheets and said frangible layer from the remainder of said one sheet and layer;

the marginal portion of said one sheet being adhered through said frangible layer to the other of said sheets substantially more strongly than is the remainder of said one sheet to said other of said sheets.

2. The composite laminar structure of claim 1 wherein said marginal portion of said one sheet is adhered through said frangible layer to the other of said sheets at a peel strength at least twice that of the peel strength of said remainder of said one sheet to said other of said sheets.

3. The composite laminar structure of claim 2 wherein said remainder of said one sheet is adhered to said other of said sheets at a peel strength of about 0.8 gram per centimeter of width of said structure to about 8 grams per centimeter of width of said structure.

4. The composite laminar structure of claim 1 wherein said frangible layer of image-forming substance comprises a layer of carbon black pigment in a binder therefor.

5. The composite laminar structure of claim 1 wherein each of said first and second sheets comprises a transparent polymeric sheet.

6. The composite laminar structure of claim 5 wherein said second sheet is thicker than said first sheet.

7. The composite laminar structure of claim 6 wherein said marginal portion is defined by a cut line severing said second sheet and said frangible layer from the remainder of said second sheet and layer.

8. The composite laminar structure of claim 7 having between said first sheet and said frangible layer a heat-activatable polymeric layer for adhering portions of said frangible layer to said first sheet, upon exposure of said laminar structure to intense radiation, at said second strength.

9. The composite laminar structure of claim 8 wherein said heat-activatable polymeric layer has a softening temperature lower than that of said first sheet.

10. The composite laminar structure of claim 1 wherein said first sheet has a thickness of from 0.013 mm to 0.178 mm and said second sheet has a thickness of from 0.038 mm to 0.254 mm and wherein said marginal portion for facilitating separation of said sheets after said thermal exposure is defined by a cut line severing a marginal portion of said second sheet and said frangible layer from the remainder of said second sheet and said frangible layer.

11. The composite laminar structure of claim 10 wherein said remainder of said second sheet is adhered through said frangible layer to said first sheet at a peel strength of 0.8 gram per centimeter of width of said structure to 8 grams per centimeter of width of said structure and said marginal portion of said second sheet is adhered through said frangible layer to said first sheet at a peel strength of from 1.6 to 16 grams per centimeter of width of said structure.

12. The composite laminar structure of claim 11 wherein said remainder of said second sheet is adhered through said frangible layer to said first sheet at a peel strength of from 1.1 to 2.8 gram per centimeter of width of said structure and said marginal portion of said second sheet is adhered through said frangible layer to said first sheet at a peel strength of from 2.2 to 5.6 gram per centimeter of width of said structure.

* * * * *